(12) United States Patent
Colmer

(10) Patent No.: US 7,567,192 B2
(45) Date of Patent: Jul. 28, 2009

(54) SIGMA-DELTA MODULATOR

(76) Inventor: Morgan James Colmer, 93 Lovell Road, Cambridge (GB) CB4 2QW ( * ) Notice: Subject to any disclaimer, the term of this patent is extended or adjusted under 35 U.S.C. 154(b) by 0 days.

(21) Appl. No.: 11/761,746

(22) Filed: Jun. 12, 2007

(65) Prior Publication Data

US 2008/0018509 A1   Jan. 24, 2008

(30) Foreign Application Priority Data

Jun. 12, 2006   (GB)   ................... 0611639.6

(51) Int. Cl.
*H03M 3/00* (2006.01)
(52) U.S. Cl. .................. 341/143; 341/118; 341/120; 341/155
(58) Field of Classification Search ............... 341/143, 341/118, 120, 155
See application file for complete search history.

(56) References Cited

U.S. PATENT DOCUMENTS

| | | | |
|---|---|---|---|
| 5,187,482 A | | 2/1993 | Tiemann |
| 5,274,375 A | * | 12/1993 | Thompson ............... 341/143 |
| 5,719,574 A | * | 2/1998 | Nishio et al. ............. 341/143 |
| 5,821,890 A | | 10/1998 | Kim et al. |
| 6,144,374 A | | 11/2000 | Hyun |
| 6,150,969 A | * | 11/2000 | Melanson ............... 341/143 |
| 6,184,812 B1 | * | 2/2001 | Younis et al. ........... 341/143 |
| 6,252,536 B1 | | 6/2001 | Johnson et al. |
| 6,278,750 B1 | * | 8/2001 | Yu ........................... 375/345 |
| 6,373,459 B1 | | 4/2002 | Jeong et al. |
| 6,611,221 B1 | * | 8/2003 | Soundarapandian et al. 341/143 |
| 6,642,873 B1 | * | 11/2003 | Kuang ..................... 341/143 |
| 6,954,161 B2 | * | 10/2005 | Inukai et al. ............. 341/143 |
| 7,061,416 B2 | * | 6/2006 | Nagai ....................... 341/143 |
| 7,219,875 B2 | * | 5/2007 | Dayton ................. 251/129.15 |
| 7,286,074 B2 | * | 10/2007 | Kudoh et al. ............ 341/162 |
| 7,298,305 B2 | * | 11/2007 | Melanson ................ 341/143 |
| 7,298,306 B2 | * | 11/2007 | Melanson ................ 341/143 |

(Continued)

FOREIGN PATENT DOCUMENTS

EP   1130784 A   9/2001

(Continued)

OTHER PUBLICATIONS

International Search Report for PCT/GB07/002163 filed Jun. 11, 2007.

(Continued)

*Primary Examiner*—Linh V Nguyen
(74) *Attorney, Agent, or Firm*—McDonnell Boehnen Hulbert & Berghoff LLP

(57) ABSTRACT

A sigma-delta modulator for forming a digital output signal representative of the magnitude of an analog input signal, the modulator comprising a modulation unit comprising: a summation unit for summing the analog input signal with an adjustment signal to form a summation output signal; an integrator arranged to receive the summation output signal and form an integrator output signal dependent thereon; and a quantizer arranged to receive the integrator output signal and form the digital output signal dependent thereon; the sigma-delta modulator further comprising a feedback loop for generating the adjustment signal and comprising a selection circuit arranged to form the adjustment signal by selecting between one of two boundary values for the adjustment signal, the selection being performed in dependence on the digital output signal.

40 Claims, 6 Drawing Sheets

U.S. PATENT DOCUMENTS

| | | | |
|---|---|---|---|
| 2001/0043153 A1* | 11/2001 | Gordon et al. | 341/143 |
| 2002/0118304 A1 | 8/2002 | Mandl | |
| 2002/0140591 A1 | 10/2002 | Laaser | |
| 2003/0085825 A1* | 5/2003 | Jensen et al. | 341/143 |

FOREIGN PATENT DOCUMENTS

| | | |
|---|---|---|
| GB | 2396264 A | 6/2004 |
| GB | 2409118 A | 6/2005 |
| JP | 11-145829 | 5/1999 |

OTHER PUBLICATIONS

Written Opinion Of The International Searching Authority for PCT/GB07/002163 filed Jun. 11, 2007.

Norsworthy S R et al: "Delta-Sigma Data Converters" Delta-Sigma Data converters. Theory Design, and Simulation, New York, NY: IEEE, US, 1997, pp. 197-199, 309, 31, XP 002322216, ISBN: 0-7803-1045-4, p. 311, lines 8-13; figure 10.1.

English Abstract of Japanese patent application No. 09-304074.

* cited by examiner

US 7,567,192 B2

SIGMA-DELTA MODULATOR

RELATED APPLICATIONS

This application claims the right of priority to United Kingdom Application No. GB 0611639.6, filed 12 Jun. 2006 (title: A SIGMA-DELTA MODULATOR; applicant: Global Silicon Limited), which is hereby incorporated by reference herein.

FIELD OF THE DISCLOSURE

The present disclosure relates to a sigma-delta modulator having a gain function and an offset function.

BACKGROUND

Sigma-delta modulators are used for analog to digital conversion. Sigma-delta modulators offer high resolution, high integration and low cost, making them an ideal choice for many applications where analog to digital conversion is required.

The operation of a sigma-delta modulator is best described using the simplest 1-bit implementation. A typical 1-bit sigma-delta modulator is illustrated in FIG. 1.

In the basic implementation illustrated in FIG. 1, the sigma-delta modulator comprises a summation unit 1, an integrator 2, a comparator 3 and a digital-to-analog converter (DAC) 4. The summation unit may be, for example, a difference amplifier. The comparator may be an analog-to-digital converter (ADC).

As can be seen in FIG. 1, the components of the modulator are connected in a feedback loop. The analog input signal is fed into the summation unit, where a feedback signal is subtracted, before being fed into a loop filter, which in this case is an integrator. The signal output from the integrator is compared with a reference signal in the comparator. If the output signal from the integrator is greater than the reference signal, a 'one' is output, and if the integrator output signal is less than the reference signal, a 'zero' is output. Thus the analog input signal has been converted into a digital output signal.

The digital output signal is fed back, via the DAC, to the summation unit, where it is subtracted from the input signal. The purpose of the feedback signal is to maintain the average output of the integrator near the comparator's reference level by making the ones and zeros of the digital output signal representative of the analog input.

The DAC in the feedback loop has an upper reference voltage and a lower reference voltage. When the comparator outputs a 'one', the DAC outputs a signal at the upper voltage and when the comparator outputs a 'zero', the DAC outputs a signal at the lower voltage. The modulator is at full-range scale when the input signal is equal to the upper or lower reference voltages of the feedback DAC. For example, if the feedback DAC outputs −2.5V when it receives a zero and +2.5V when it receives a one then the range of the input is ±2.5V. The reference voltage of the comparator is halfway between the upper and lower boundaries of the input range, e.g. for an input range of ±2.5V the reference voltage for the comparator would be 0V. The reference voltage for the comparator represents the virtual ground level for the modulator. For modulators having an input range that is symmetrical about zero, the virtual ground level is zero.

The output from the sigma-delta modulator is a stream of ones and zeros. The ratio of ones to zeros represents the magnitude of the input signal compared with the input range of the modulator. For example, if the range of the modulator is ±2.5V and the input signal has a magnitude of 1.0V, then the input signal is 3.5V above the lower boundary of a 5V range. In this example, 70% of the output signal should consist of ones. For the modulator to produce a digital output signal that is an accurate representation of the analog input signal, the modulator must sample at a much greater rate than the rate of change of the analog input signal.

More sophisticated sigma-delta modulators than the 1-bit modulator described above may have multiple modulators and integrators.

A sigma-delta modulator offers improved noise performance over traditional ADCs. This is achieved through oversampling, noise shaping, digital filtering and decimation.

BRIEF DESCRIPTION OF THE DRAWINGS

For a better understanding of the present disclosure, reference is made by way of example to the following drawings, in which.

DETAILED DESCRIPTION

A traditional multi-bit ADC converts an analog signal into a digital signal by sampling the input signal at regularly spaced intervals in time and classifying the magnitude of the input signal as being one of a number of equally spaced, predetermined magnitudes. The simplest 1-bit ADC classifies the input signal according to two predetermined magnitude levels and the outputs either a one or a zero according to which of the two levels the input signal is closest to. Likewise, a 2-bit ADC classifies the input signal according to four predetermined levels and outputs either 00, 01, 10 or 11 during each sampling period and so on. The greater the number of magnitude levels to which the input signal is compared, the greater the resolution of the converter. By according the input signal one of an equally spaced number of values, the output of the ADC is inherently inaccurate. This is because the ADC input is a continuous signal with an infinite number of possible states while the output signal is a discrete function whose number of different states is determined by the converter's resolution. The conversion from analog to digital loses some information and introduces distortion into the signal. The magnitude of this error is random, with values up to ±LSB (the least significant bit of the digital output).

Figure 2A:
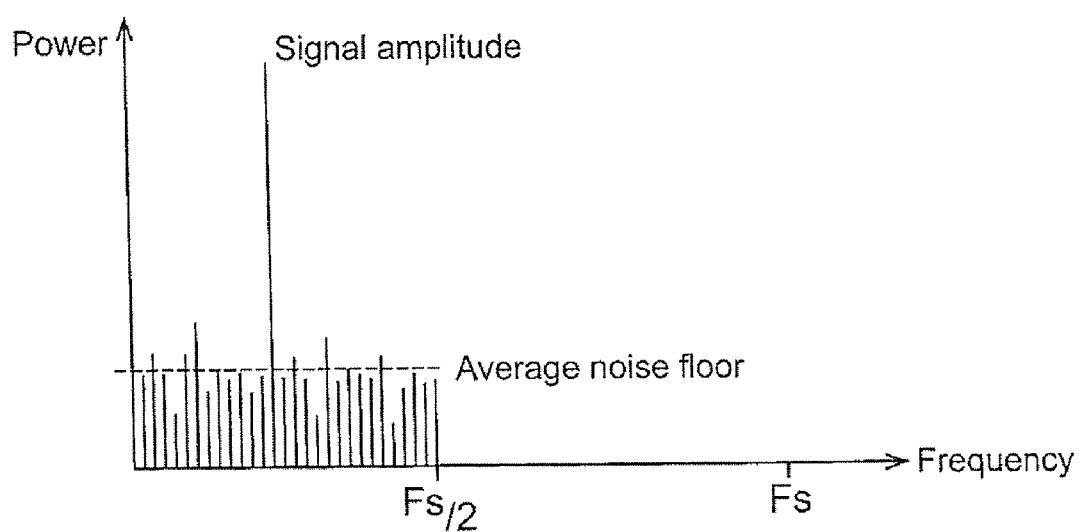
FIGS. 2a-c show the effect of oversampling and digital filtering on the output noise level of an ADC.

A typical graph that would be obtained from an FFT analysis of the output signal from a traditional multi-bit ADC with a sine-wave input signal is illustrated in FIG. 2a. Fs is the sampling frequency of the input signal, which must be at least twice the bandwidth of the input signal according to Nyquist theory. The FFT analysis breaks down the signal into its frequency components. The sine-wave is clearly visible as a large spike at a single frequency. However, lots of random noise is also visible extending from DC to Fs/2. This noise is a result of the distortion discussed above and is known as quantization noise.

The signal-to-noise ratio (SNR) is obtained by dividing the signal amplitude by the RMS sum of all the frequencies representing noise. In a conventional ADC the SNR can only be improved by increasing the resolution (i.e., the number of bits).

Figure 2B:
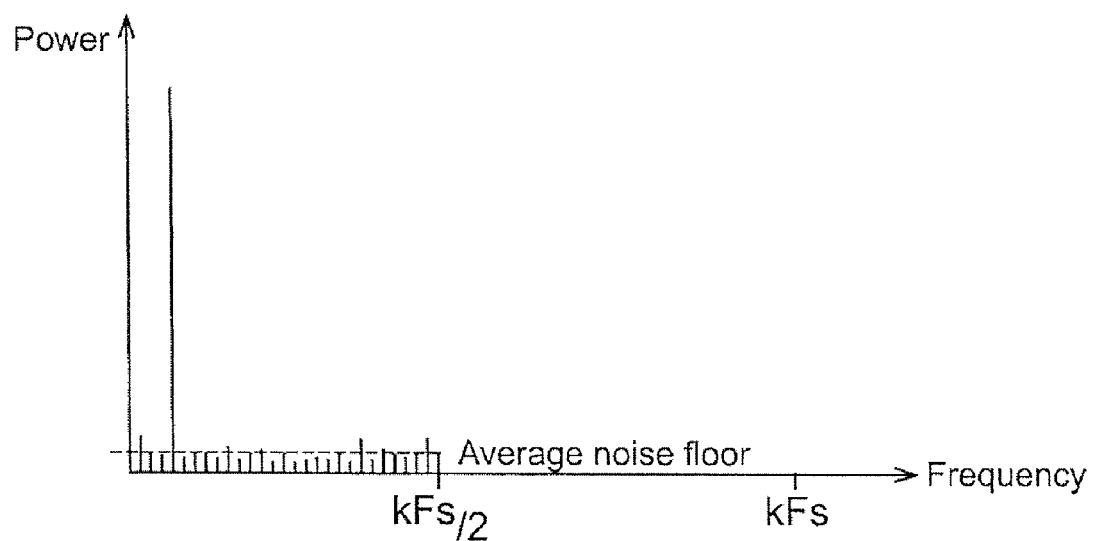
Figure 2C:
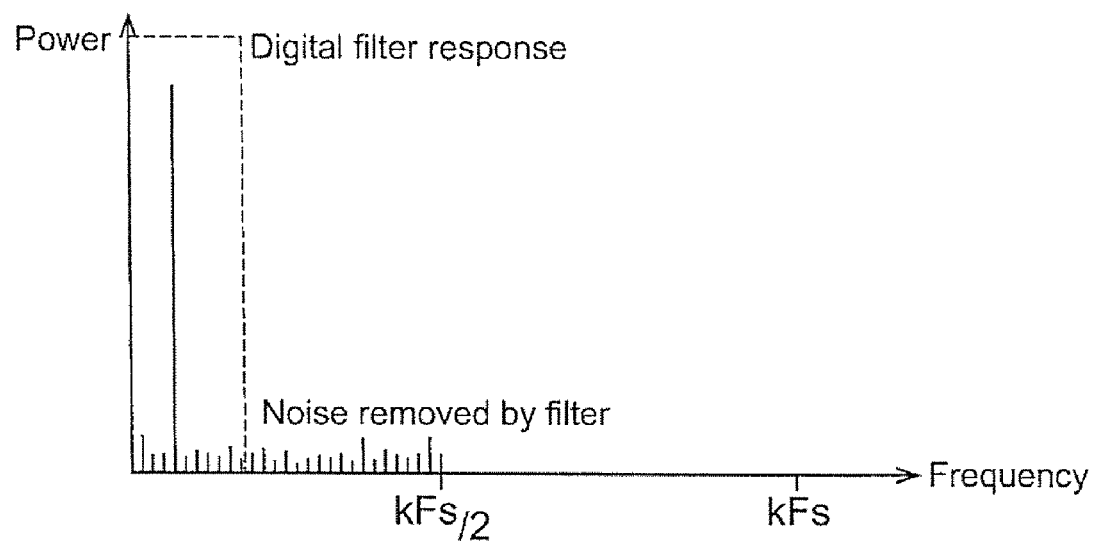

If the sampling frequency is increased by the oversampling ratio k, to kFs, the noise floor drops. This is illustrated in FIG. 2b. The SNR is unchanged from the situation in FIG. 2a, but the noise has been spread over a wider frequency range. Sigma-delta converters are able to exploit this effect by following the 1-bit ADC with a digital filter. The effect of the filter is illustrated in FIG. 2c. The RMS noise is less, because most of the noise passes through the digital filter. This action allows sigma-delta modulators to achieve a wide dynamic range from a low-resolution ADC.

However, the sigma-delta modulator cannot achieve a high resolution from oversampling alone as the oversampling ratio required for even a reasonable resolution is generally too high to be realizable. The sigma-delta modulator also shapes noise away from the peak gain response of the modulator.

Figure 1:
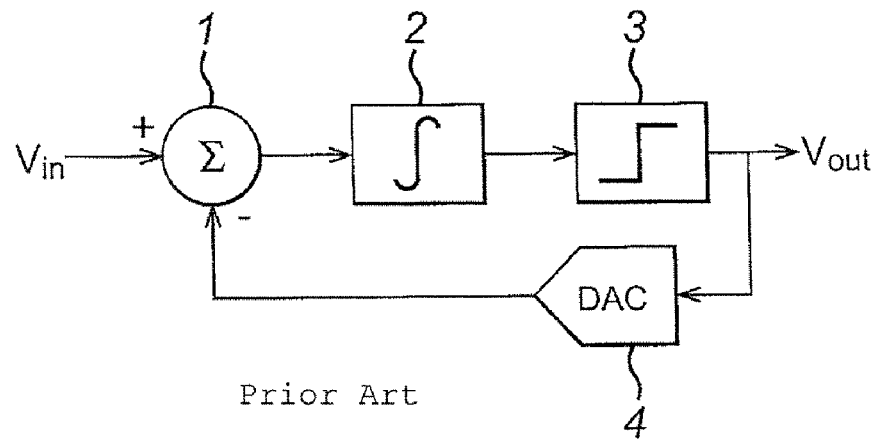
FIG. 1 shows a sigma-delta modulator according to the prior art.
Figure 3A:
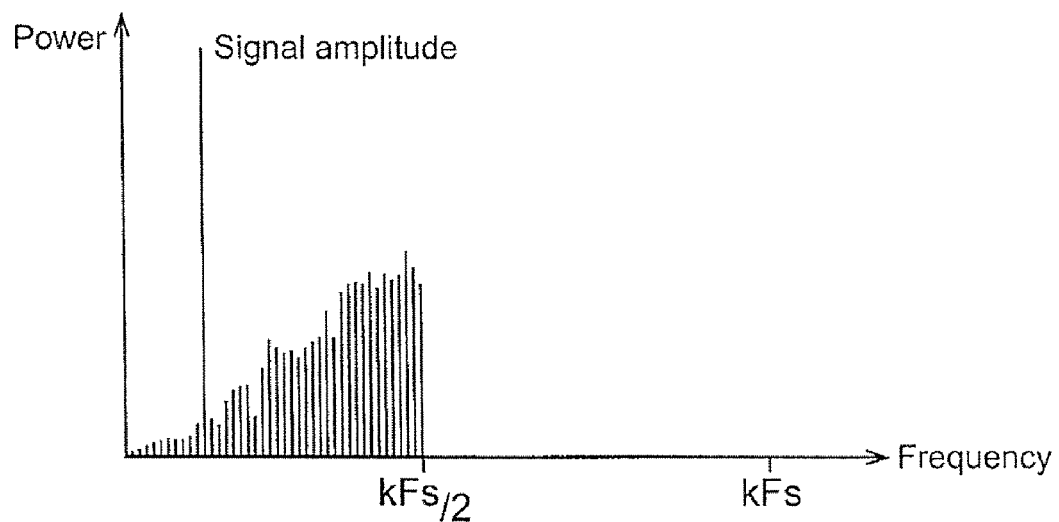
FIGS. 3a-b show the effect of noise shaping on the output noise level of an ADC.

In the modulator illustrated in FIG. 1, the loop filter is an integrator, so the modulator shapes noise out of the lower frequencies and into the higher frequencies. This is because the integrator sums the error voltage, thereby acting as a low pass filter to the input signal and a high pass filter to the quantization noise. Thus, most of the quantization noise is pushed into higher frequencies (see FIG. 3a). Oversampling has not changed the total noise power, but its distribution.

For higher order sigma-delta modulators, noise shaping can be achieved by including more than one stage of integration and summation.

Figure 3B:
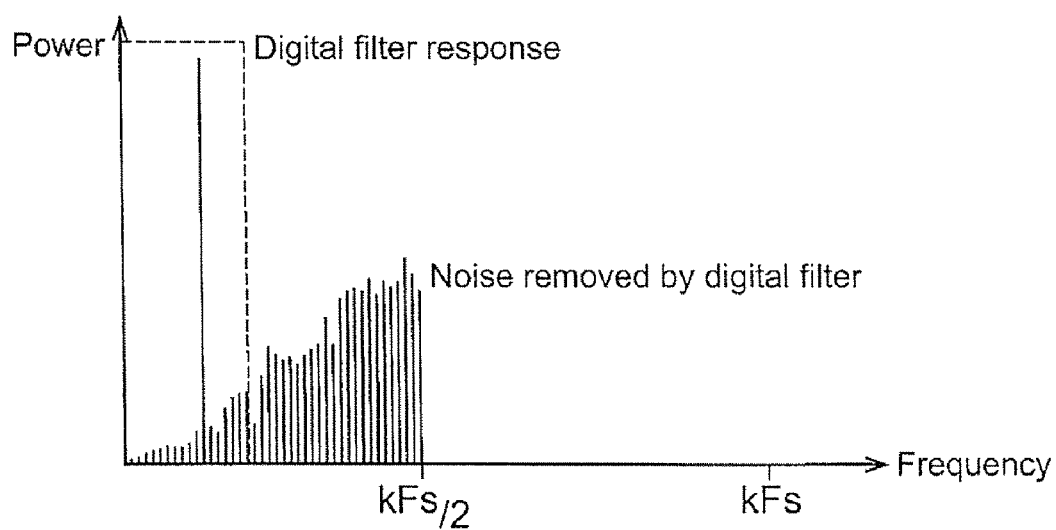

If a digital filter is applied to the noise-shaped output of the sigma-delta modulator, as illustrated in FIG. 3b, it removes more noise than does oversampling alone.

Figure 4:
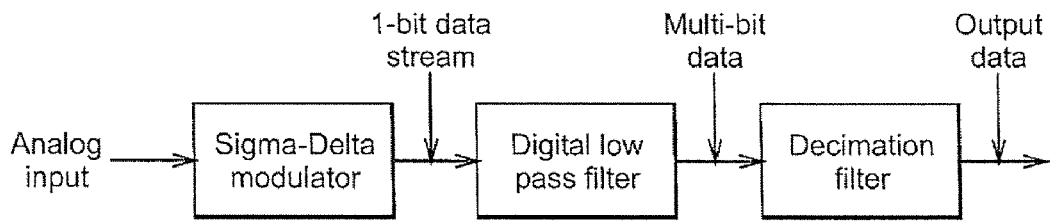
FIG. 4 shows an overview of the stages involved in reducing noise levels in the output signal.
Figure 5:
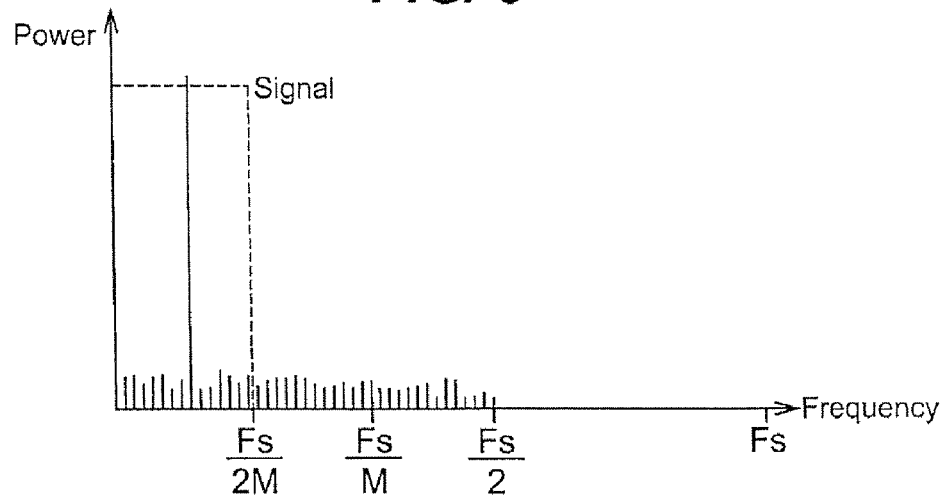
FIG. 5 shows the effects of decimation on noise reduction.

The output of the sigma-delta modulator is a stream of ones and zeros at the sampling rate. This data rate is usually very high, so a digital-and-decimation filter can be used to reduce the data rate to a more useful value. No useful information is lost during this process, as illustrated in FIG. 5. As the bandwidth of the signal is reduced by the digital output filter, the output data rate can satisfy the Nyquist criterion even though it is lower that the original sampling rate. This can be accomplished by preserving certain input values and discarding the rest. This process is known by decimation by a factor M (the decimation ratio). M can have any integer value, provided that the output data rate is more than twice the signal bandwidth. If the input has been sampled at Fs, the filtered-output data rate can be reduced to Fs/M without loss of information. The complete system, as described, above is illustrated in FIG. 4.

The sigma-delta modulator offers best resolution when the input signal varies between the upper and lower limits of the modulator's input range. The upper and lower limits can be considered as ±Vcc/2 about the virtual ground level of the modulator (i.e., the modulator has an input range of Vcc). One option for optimizing the resolution of the sigma-delta modulator is to implement a gain function in a sigma-delta modulator by introducing transition-cycles into the feedback path. Transition-cycles have a net average value equal to the virtual ground level of the modulator. By introducing more transition-cycles into the feedback path, the overall average level of the feedback is reduced.

Figure 6:
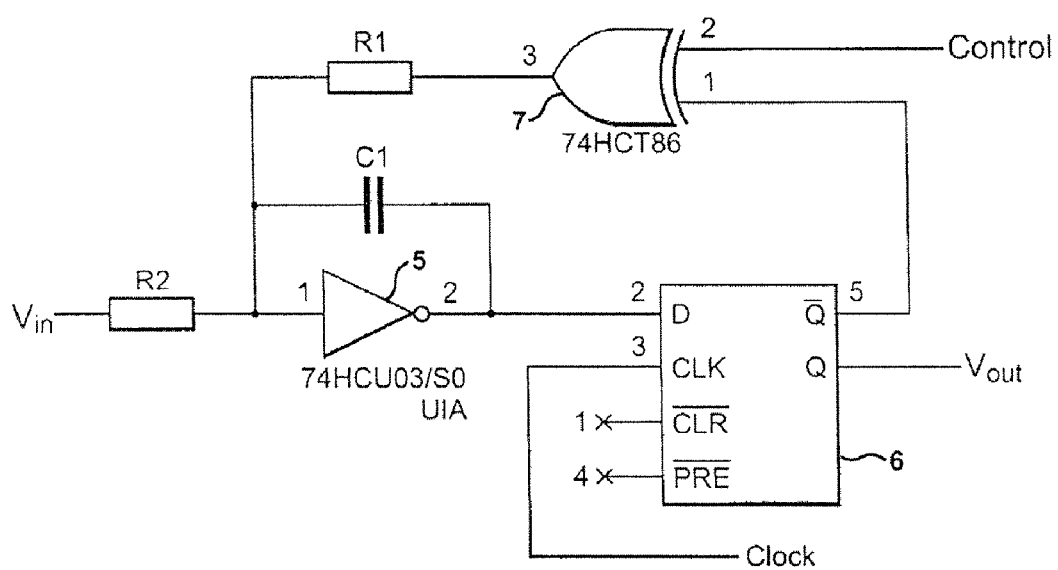
FIG. 6 shows a sigma-delta modulator according to one embodiment.

FIG. 6 illustrates a sigma-delta modulator that introduces transition-cycles into the feedback path. The loop filter 5 is an integrator circuit, the quantizer is a latch 6 and the feedback DAC has been replaced by an exclusive-OR gate (an XOR gate) 7. The XOR gate has as its inputs the digital feedback signal and a control signal.

Figure 7:
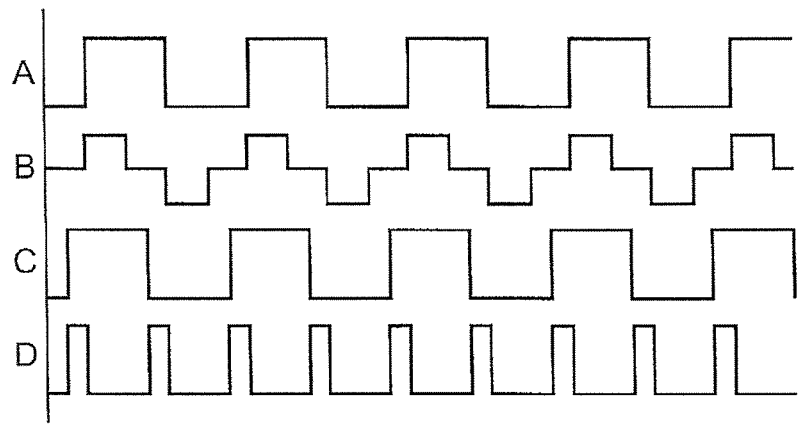
FIG. 7 shows waveforms for implementing a gain function in a sigma-delta modulator.

Waveform A of FIG. 7 shows a typical feedback signal for an input that is at the virtual ground level. In FIG. 7, the virtual ground level has been set at ½ Vcc. The signal has a 50% duty cycle, i.e. half the cycles take the upper limit of Vcc and half the lower limit of 0V. The signal therefore represents an input having a magnitude that is midway between the upper and lower limits of the input range of the modulator (i.e., ½ Vcc in this case).

Waveform B of FIG. 7 illustrates an equivalent feedback signal including transition-cycles. Waveform A, which is a non-return-to-zero or NRZ waveform, has been converted to a return-to-zero (RTZ) waveform, As can be seen from the figure, the transition-cycles have a net average value of ½ Vcc (virtual ground).

Waveform B illustrated in FIG. 7 is difficult to directly synthesize. However, since the requirement for the transition-cycles is only that their net average value is equal to the virtual ground level, waveform C in FIG. 7 will have the same effect on the overall feedback level seen by the integrator as waveform B. In waveform C the transition-cycles have, in effect, been implemented as a pair of pulses, having an average value of ½ Vcc.

Waveform C can be easily generated from waveform A by using an XOR gate with waveform D (also illustrated in FIG. 7). Therefore, in the sigma-delta modulator shown in FIG. 7, the digital output signal (waveform A) and the control signal (waveform D) are input into an XOR gate to create the feedback signal (waveform C). Note that the feedback signal still has a 50% duty cycle so the modulator is still balanced with an input of ½ Vcc. In other words, for an input signal at virtual ground, the situation is unchanged by the introduction of transition-cycles into the feedback signal.

Figure 8:
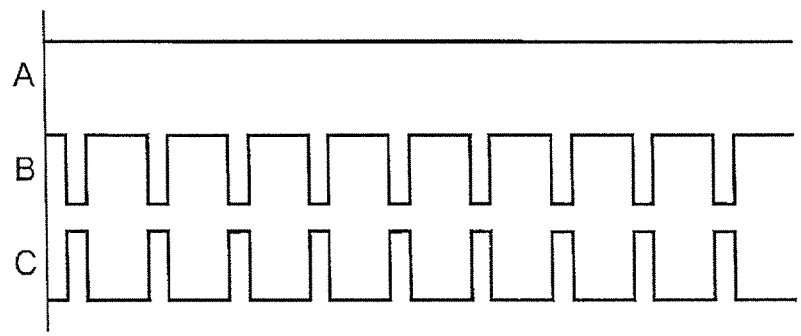
FIG. 8 shows waveforms for implementing a gain function in a sigma-delta modulator.

Waveforms A, B and C of FIG. 8 are similar waveforms for the situation where the modulator has a full scale positive input (Vcc). The digital output signal of the modulator is waveform A. As the input is at the upper limit, the output signal is always high (100% ones). If the same control signal (waveform C) were applied to the XOR gate along with the digital output signal, then the feedback waveform B is generated. This time, the feedback signal has a net DC content of ¾ Vcc. Therefore, an input of ¾ Vcc would be balanced by this feedback signal and the upper input limit to the modulator has been reduced by ¼ Vcc.

Similarly, if the input to the modulator has a full scale negative input (0V), the same control signal would produce a feedback signal having a net DC content of ¼ Vcc. Therefore, an input of ¼ Vcc would be balanced by this feedback signal and the upper input limit to the modulator has been increased by ¼ Vcc.

Therefore, overall, the waveform D of FIG. 7 and waveform C of FIG. 8 have managed to decrease the input range of the modulator from Vcc to ½ Vcc. The modulator has an implied gain of two. By reducing the input range into the modulator by half, the control signal has effectively achieved the same result as an amplification by a factor of two prior to the sigma-delta modulator.

The control and feedback signals in one embodiment have a higher frequency than the digital output signal. To achieve this the XOR gate and the quantizer can receive different clock signals.

The control signal can also be used to apply an offset. This can be achieved using the same basic circuit as illustrated in FIG. 6. In this application, the control signal is arranged such that transition-cycles are injected into the feedback signal in an asymmetric manner. Replacing more 'ones' than 'zeros' in the output signal causes the generated feedback signal to apply a positive offset to the input signal. This is because the net DC content of the feedback signal is decreased relative to the situation where the same number of transition-cycles is inserted into the feedback signal, but in a symmetric manner. Similarly, by replacing more 'zeros' than 'ones', a negative offset can be applied.

Introducing transition cycles into the feedback signal means that some of the spectral noise shaping information is removed. There is therefore inevitably a reduction in the SNR that is achievable by the modulator. For example, in the situation where the control signal is of the form of waveform D of FIG. 7 and waveform C of FIG. 8, there is a situation where a quarter of the signal being fed back into the modulator is replaced with transition-cycles. In other words, only 75% of the feedback signal comprises noise shaping content while the remaining 25% comprises gain scaling (and offset) content. Therefore, for a gain of 6 dB (a factor of 2), the SNR degradation is 2.5 dB (a factor of approximately 1.3).

There is therefore a need for a sigma-delta modulator that can apply an implied offset and/or gain to an analog input signal via a feedback signal while retaining the spectral noise shaping information of that feedback signal.

According to a first embodiment, there is provided a sigma-delta modulator for forming a digital output signal representative of the magnitude of an analog input signal, the modulator comprising a modulation unit comprising: a summation unit for summing the analog input signal with an adjustment signal to form a summation output signal; an integrator arranged to receive the summation output signal and form an integrator output signal dependent thereon; and a quantizer arranged to receive the integrator output signal and form the digital output signal dependent thereon; the sigma-delta modulator further comprising a feedback loop for generating the adjustment signal and comprising a selection circuit arranged to form the adjustment signal by selecting between one of two boundary values for the adjustment signal, the selection being performed in dependence on the digital output signal.

In one embodiment, the modulation unit and the feedback loop are respectively arranged to iteratively generate the digital output signal and the adjustment signal, the selection circuit being arranged to select between one of the two boundary values at each iteration.

The selection circuit may be arranged to select between one of the two boundary values in dependence on the instantaneous value of the digital output signal.

The quantizer may be arranged to form the digital output signal by selecting between a first voltage level and a second voltage level for the digital output signal, the selection circuit being arranged to select a first one of the boundary values responsive to the digital output signal having the first voltage level and to select a second one of the boundary values responsive to the digital output signal having the second voltage level.

In one embodiment, at least one of the first boundary value and the second boundary value is different from both the first voltage level and the second voltage level.

The modulation unit is arranged in one embodiment such that if the first and second boundary values are held constant then the digital output signal is representative of the level of the analog input signal in the range between the two boundary values.

The selection circuit may be capable of varying the boundary values.

The selection circuit may comprise a multiplexer arranged to receive the digital output signal and to output one of the two boundary values in dependence on the digital output signal. The selection circuit may also comprise a control unit arranged to generate first and second control signals in dependence on the analog input signal. In one embodiment, the selection circuit is arranged to generate the first and second control signals such that those signals are digital signals.

In one embodiment, the selection circuit comprises a first digital-to-analog converter and a second digital-to-analog converter, each of the first and second digital-to-analog converters being arranged to receive a respective one of the first and second control signals and to output a respective boundary value in dependence on that control signal.

The control unit in one embodiment generates the first and second control signals so as to cause effective amplification of the analog input signal by the sigma-delta modulator. The control unit may also generate the first and second control signals so as to cause effective offset of the analog input signal by the sigma-delta modulator.

Each of the two boundary values may correspond to a respective voltage level. The control unit may be operable to cause effective amplification of the analog input signal by generating the first and second control signals such that the difference between the two respective voltage levels is decreased. The control unit may be operable to cause effective offset of the analog input signal by generating the first and second control signals such that the sum of the two respective voltage levels is non-zero.

The control unit may be arranged to determine that the analog input signal extends outside of the upper boundary and/or the lower boundary of the allowable range of the input signal.

The control unit in one embodiment is arranged to decrease the effective amplification of the analog input signal responsive to a determination that the analog input signal extends outside of the upper boundary and/or the lower boundary of the allowable range for the analog input signal and to cause effective offset of the analog input signal responsive to a determination that the analog input signal extends outside of the upper boundary or the lower boundary of the allowable range for the analog input signal.

The control unit may be arranged to compare the analog input signal to a first relatively high threshold, and to increase the effective amplification of the analog input signal if the analog input signal is below the first relatively high threshold. The control unit may be arranged to compare the analog input signal to a second relatively high threshold, and to decrease the effective amplification of the analog input signal if the analog input signal is below the second relatively high threshold. In one embodiment, the second relatively high threshold is above the first relatively high threshold.

The control unit may be arranged to compare the analog input signal to a first relatively low threshold, and to increase the effective amplification of the analog input signal if the analog input signal is above the first relatively low threshold. The control unit is arranged to compare the analog input signal to a second relatively low threshold, and to decrease the effective amplification of the analog input signal if the analog input signal is below the second relatively low threshold. In one embodiment, the second relatively low threshold is below the first relatively low threshold.

The control unit may be arranged to compare the analog input signal with the first relatively high threshold and the first relatively low threshold, and to cause effective offset of the analog input signal if it extends either above the first relatively high threshold or below the first relatively low threshold without also extending respectively either below the first relatively low threshold or above the first relatively high threshold.

The control unit may be arranged to generate the control signals by means of a predetermined algorithm. The control unit may be arranged to select one of a plurality of algorithms for generating the control signals in dependence on the analog input signal.

The sigma-delta modulator may have a non-linear transfer function. The control unit may be operable to cause greater effective amplification of analog input signals varying within a relatively small voltage range than of analog input signals varying within a relatively large voltage range.

The control unit may be implemented in software.

In one embodiment, the selection is performed in dependence on only the digital output signal.

According to a second embodiment, there is provided a digital media player comprising a detection device for detecting digital data and having a sigma-delta modulator for receiving an analog input signal and forming a digital output signal representative of the magnitude of the analog input signal, the modulator comprising a summation unit for summing the analog input signal with an adjustment signal to form a summation output signal, an integrator arranged to receive the summation output signal and form an integrator output signal dependent thereon, a quantizer arranged to receive the integrator output signal and form the digital output signal dependent thereon and a feedback loop for generating the adjustment signal and comprising a selection circuit arranged to form the adjustment signal by selecting between one of two boundary values for the adjustment signal, the selection being performed in dependence the digital output signal.

In one embodiment, each of the two boundary values corresponds to a respective voltage level and the digital media player comprises a control unit arranged to generate first and second control signals for setting the respective voltage levels.

The control unit may be arranged to select predetermined first and second control signals dependent on the type of digital data detected by the detection device.

The control unit may be arranged to receive information from the detection device, said information being dependent on the digital data detected by the detection device, and to generate the first and second control signals in dependence on the received information.

The digital media player may be arranged for playing optical disks and the control device may be arranged to receive a signal from the detection device that is representative of a reflectivity of an optical disk, the control unit being arranged to generate the first and second control signals in dependence on that signal.

The player may be arranged for playing optical discs and the detection device may be arranged to detect the content of an optical disc and generate the analog input signal in dependence thereon.

According to a third embodiment, there is provided a method for forming a digital output signal representative of the magnitude of an analog input signal by means of a sigma-delta modulator, the method comprising the steps of summing the analog input signal with an adjustment signal by means of a summation unit to form a summation output signal, receiving the summation output signal in an integrator, which is arranged to form an integrator output signal dependent thereon, receiving the integrator output signal in a quantizer, which is arranged to form the digital output signal dependent thereon and generating the adjustment signal by selecting between one of two boundary values for the adjustment signal by means a feedback loop; the feedback loop comprising a selection circuit arranged to perform the selection in dependence on the digital output signal.

According to a fourth embodiment, there is provided a sigma-delta modulator for forming a digital output signal representative of the magnitude of an analog input signal, the modulator comprising a modulation unit comprising: a summation unit for summing the analog input signal with an adjustment signal to form a summation output signal; an integrator arranged to receive the summation output signal and form an integrator output signal dependent thereon; and a quantizer arranged to receive the integrator output signal and form the digital output signal dependent thereon; the sigma-delta modulator further comprising a feedback loop for generating the adjustment signal and comprising a selection circuit arranged to form the adjustment signal in dependence on the digital output signal such that in response to a transition between two output values in the digital output signal the adjustment signal is formed to have a coincident transition between two boundary values.

The selection circuit may be arranged to form the adjustment signal such that at least one of the two boundary values is different from both of the two output values.

The two output values and the two boundary values may each comprise a relatively high value and a relatively low value. The selection circuit may be arranged to, in response to a transition in one direction between the relatively high output value and the relatively low output value in the digital output signal, form the adjustment signal to have a transition in the same direction between the relatively high boundary value and the relatively low boundary value.

According to a fifth embodiment, there is provided a digital media player comprising a detection device for detecting digital data and having a sigma-delta modulator for receiving an analog input signal and forming a digital output signal representative of the magnitude of the analog input signal, the modulator comprising: a modulation unit comprising: a summation unit for summing the analog input signal with an adjustment signal to form a summation output signal; an integrator arranged to receive the summation output signal and form an integrator output signal dependent thereon; and a quantizer arranged to receive the integrator output signal and form the digital output signal dependent thereon; the sigma-delta modulator further comprising a feedback loop for generating the adjustment signal and comprising a selection circuit arranged to form the adjustment signal in dependence on the digital output signal such that in response to a transition between two output values in the digital output signal the adjustment signal is formed to have a coincident transition between two boundary values.

According to a sixth embodiment, there is provided a method for forming a digital output signal representative of the magnitude of an analog input signal by means of a sigma-delta modulator, the method comprising the steps of summing the analog input signal with an adjustment signal by means of a summation unit to form a summation output signal, receiving the summation output signal in an integrator, which is arranged to form an integrator output signal dependent thereon, receiving the integrator output signal in a quantizer, which is arranged to form the digital output signal dependent thereon and generating the adjustment signal in dependence on the digital output signal such that in response to a transition between two output values in the digital output signal the adjustment signal is formed to have a coincident transition between two boundary values.

As explained above, the allowable input range of a sigma-delta modulator is determined by the upper and lower voltages of the feedback signal. In a sigma-delta modulator according to various embodiments, the upper and lower voltages of the feedback signal are set by two boundary voltages. The feedback signal is formed by using the digital output signal to select between the two boundary voltages. The implied gain and offset of the sigma-delta modulator is controlled by selecting appropriate values for the boundary voltages.

A sigma-delta modulator according to one embodiment will now be described with reference to a specific implementation. It should be understood that this is for the purposes of example only and that the disclosure encompasses any sigma-delta modulator in which implied gain and/or offset can be controlled by adjusting the upper and lower voltages of the feedback signal.

Figure 9:
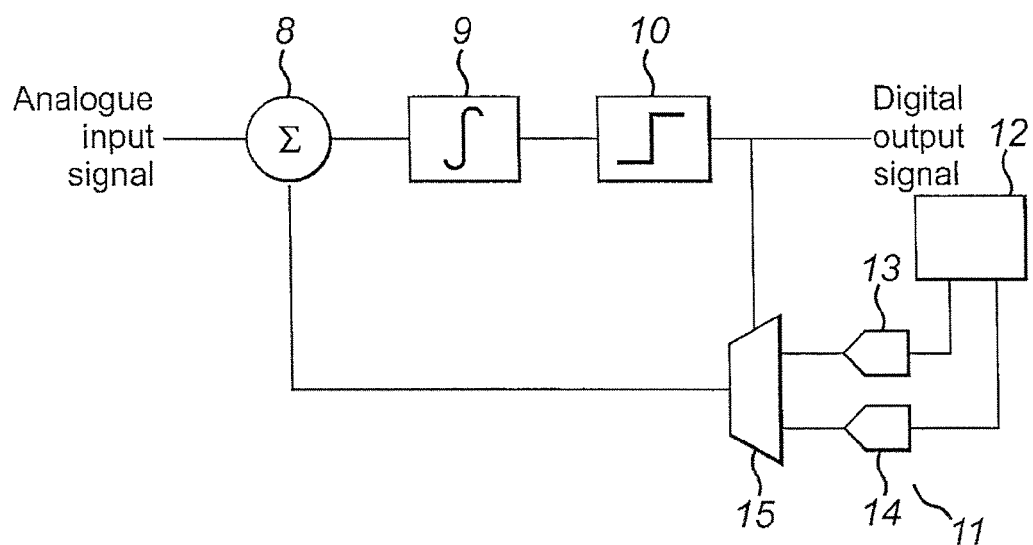
FIG. 9 shows a sigma-delta modulator according to another embodiment.

A sigma-delta modulator according to one embodiment is illustrated in FIG. 9. The modulator comprises a summation unit 8, an integrator 9, a quantizer 10 and a selection circuit 11 connected in a feedback loop.

The summation unit is arranged to receive an analog input signal and an adjustment signal, which is output by the selection circuit. The summation unit subtracts the adjustment signal from the analog input signal and outputs the subtracted signal to the integrator. The integrator filters the subtracted signal and outputs the filtered signal to the quantizer, which compares the integrated signal to a reference signal in the comparator. If the output signal from the integrator is greater than the reference signal, a 'one' is output, and if the integrator output signal is less than the reference signal, a 'zero' is output. Thus the analog input signal has been converted into a digital output signal.

The modulator outputs the digital output signal. The digital output signal is also fed back to the selection circuit. The role of the selection circuit is to set the input range of the sigma-delta modulator via the adjustment signal.

The selection circuit according to the embodiment shown in FIG. 9 comprises a multiplexer 15, a first DAC 13, a second DAC 14 and a control unit 12. The multiplexer receives as inputs the digital output signal and two boundary values. Each boundary value is a voltage output from a respective one of the two DACs. The first DAC outputs a first boundary value and the second DAC outputs a second boundary value. The voltage output by each DAC is controlled by a control signal generated by the control unit. The control unit is therefore able to control the boundary values input into the multiplexer via the two control signals.

The control unit may be implemented in software. In one embodiment, the control signals generated by the control unit are digital signals.

The digital output signal controls which of the two boundary values is output by the multiplexer at any given time. When the digital output signal is high, i.e. when the sigma-delta modulator is outputting a 'one', the multiplexer outputs one of the two boundary values. When the digital output signal is low, i.e. when the sigma-delta modulator is outputting a 'zero', the multiplexer outputs the other of the two boundary values. The adjustment signal output by the multiplexer therefore contains the same sequence of ones and zeros as the digital output signal, but with the voltage level of each 'one' and 'zero' in the digital output signal replaced by a respective one of the two boundary values. Therefore, a transition between a 'one' and a 'zero' in the digital output signal is represented by a coincident transition between the two boundary values in the adjustment signal. The coincident transition in the adjustment signal may be in the same direction as the transition in the digital output signal, i.e. a transition between a 'zero' and a 'one' in the digital output signal may be represented by a transition from the lower of the two boundary values to the higher of the two boundary values in the adjustment signal.

The selection unit in one embodiment is capable of adjusting the two boundary values. The upper and lower limits between which the adjustment signal varies can be controlled by adjusting the two boundary values. In this way, the gain and offset applied to the analog input signal by the sigma-delta modulator can be directly controlled by the control unit.

The boundary values may be different from the voltage levels representing 'ones' and 'zeros' in the digital output signal. For example, the lower of the two boundary values could be different from the voltage level representing a 'zero' in the digital output signal, the higher of the two boundary values could be different from the voltage level representing a 'one' in the digital output signal or both boundary values could differ from the respective voltage levels in the digital output signal.

For example, if the two boundary values are originally set to be +2.5V and −2.5V respectively, then the input range of the sigma-delta modulator is ±2.5V. If the two boundary values are changed to be +2.0V and −2.0V respectively, then the input range of the sigma-delta modulator is ±2.0V, which is a reduction of 1V. The implied gain of the modulator has therefore been increased by 20%. Similarly, if the two boundary values are changed so their sum is non-zero, for example, by changing one boundary value to 0V and the other to 5V, then an implied offset is applied to the analog input signal by the net increase in the DC content of the adjustment signal. An implied negative offset is therefore applied to the analog input signal. If the two boundary values are adjusted such that the net DC content of the adjustment signal is decreased (i.e., if the sum of the two boundary values is negative), then an implied positive offset is applied to the input signal.

The sigma-delta modulator according to various embodiments is advantageous because it provides variable gain and offset via a feedback signal without incurring the noise penalties of existing modulators. By varying the upper and lower voltage thresholds of the feedback signal directly, the sigma-delta modulator is able to adjust the net DC content of the feedback signal without having to remove any of the spectral noise shaping information. The spectral noise shaping information is able to be retained in the feedback signal because the original sequence of 'ones' and 'zeros' present in the digital output signal is retained.

The sigma-delta modulator according to certain embodiments straightforwardly retains the spectral noise shaping information of the digital output signal in the adjustment signal by means of the selection circuit selecting between one of two boundary values for the adjustment signal in dependence only on the digital output signal. An example of such a selection circuit is shown in FIG. 9. Performing the selection in dependence on only the digital output signal provides a simple way of reproducing transitions in the digital output signal in the adjustment signal.

The sigma-delta modulator according to various embodiments also provides variable gain and offset at a lower cost than existing modulators.

The sigma-delta modulator according to various embodiments may be advantageously used in applications in which the modulator receives input signals that vary over different voltage ranges. For example, radio frequency signals received by an antenna will tend to vary across different amplitude ranges depending on the distance between the transmitting and receiving antennas. For signals received from a distant transmitter, the implied gain of the sigma-delta modulator can be increased so that the resolution of the modulator is sufficiently sensitive for the low amplitude signals.

In another application, sigma-delta modulators may be used in CD-players. CDs vary in their reflectivity; for example, CD-RW discs have a reflectivity that is about four times less than CD-R discs or pressed discs. Traditionally, this variation in reflectivity has been accounted for by using a single gain switch option in the analog amplifiers before the modulator. However, this difference in reflectivity can be compensated for using a sigma-delta modulator according to various embodiments by simply adjusting the implied gain of the modulator via the feedback loop.

For applications in which the sigma-delta modulator receives input signals that vary over different, known voltage ranges depending on the source of the input signal, the control unit may have a set of appropriate boundary values stored for each source (for example, different types of CDs). The control unit can then use appropriate boundary values for the source that is providing the analog input signal. The control unit may be limited to using those predetermined boundary values. Alternatively, the control unit may be able to vary the initial boundary values. Such variation in the initial boundary values may be confined within certain limits. The control unit may receive information regarding the source of the input signal from an external source, such as a user operated switch. Alternatively, the control unit may analyze the analog input signal to determine its voltage range and use this analysis to determine which of the predetermined boundary values should be used.

A further advantage of the sigma-delta modulator according to various embodiments is that it provides an analog-to-digital converter in which implied gain and offset can be controlled more directly than in existing sigma-delta modulators. It can therefore be used in implementations in which it is beneficial to apply variable gain and offset to the analog input signal. For example, the control unit may monitor the analog input signal and adaptively adjust the gain and offset accordingly. Such adaptive gain and offset control is useful for applications in which the amplitude of the analog input signal contains undesirable fluctuations that are unrelated to the information content of the signal. For example, in CD players the reflectivity of a CD tends to vary over the radius of a disc which causes fluctuations in the analog signal that are unrelated to the audio content of the signal. The sigma-delta modulator according to various embodiments can minimize the effect of such unwanted fluctuations by adaptively adjusting the gain and offset applied to the analog input signal.

Figure 10:
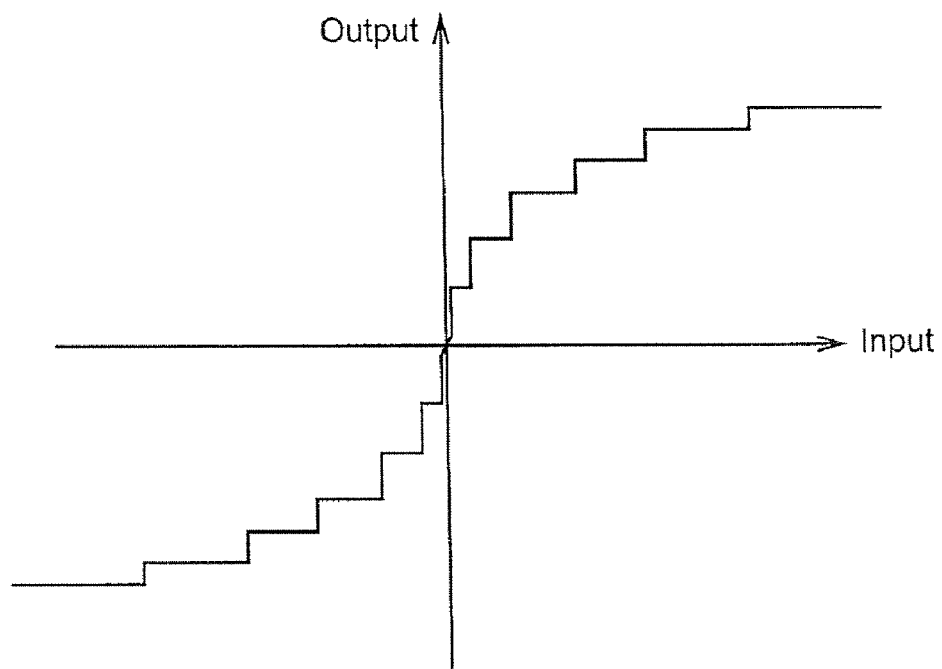
FIG. 10 shows a non-linear transfer function of a sigma-delta modulator.

Adaptive gain control is also useful for adjusting the sensitivity of the modulator in dependence on the input signal. In some applications, it is desirable for the sigma-delta modulator to have a non-linear transfer function (such as that shown in FIG. 10) so that the modulator displays greater sensitivity when the analog input signal is of low amplitude. For example, speech has a wide dynamic range and perceived intensity of audio signals is logarithmic rather than linear. Therefore, when converting an analog speech signal to a digital signal, it can be advantageous to adapt the resolution of the modulator to the varying dynamic range of the signal.

In order to implement a non-linear transfer function the control unit may be programmed to use an appropriate algorithm. Suitable examples include the µ-law and A-law algorithms used in digital communications systems. The control unit may use a different algorithm in dependence on the type of the analog input signal. For example, a different algorithm may be implemented for an analog input signal representing a visual signal than for an analog input signal representing an audio signal. The transfer function of the sigma-delta modulator will be dependent on what algorithm is executed by the control unit.

The control unit may be arranged to monitor the analog input signal. For example, the control unit may look for clipping of the input signal, indicating that its amplitude exceeds either of the upper and lower limits of the allowable input range. For example, the control unit may sample the analog input signal and compare those samples with the upper and lower limits between which the adjustment signal varies. If the magnitude of some of the samples exceeds the magnitude of either of the upper or lower limits then the control unit may increase the magnitude of the two boundary values accordingly, thereby decreasing the implied gain of the sigma-delta modulator. Alternatively, if the magnitude of some of the samples is considerably smaller than the magnitude of either of the upper or lower limits and neither of these limits is exceeded, then the control unit may decrease the magnitude of the two boundary values and thereby increase the implied gain of the sigma-delta modulator.

The control unit may also adjust the offset of the sigma-delta modulator. For example, if the magnitude of some of the samples exceeds the magnitude of only one of the upper and lower limits, then it may be more appropriate for the control unit to adjust the offset of the sigma-delta modulator rather than the gain. This may be achieved by keeping the difference in voltage between the two boundary values the same but increasing or decreasing each boundary value by an appropriate amount.

To prevent clipping, in one embodiment the control unit may compare the sampled values of the analog input signal with thresholds set above and below the lower and upper limits of the allowable input range respectively, so that corrective action may be taken by the control unit before clipping actually occurs.

Figure 11:
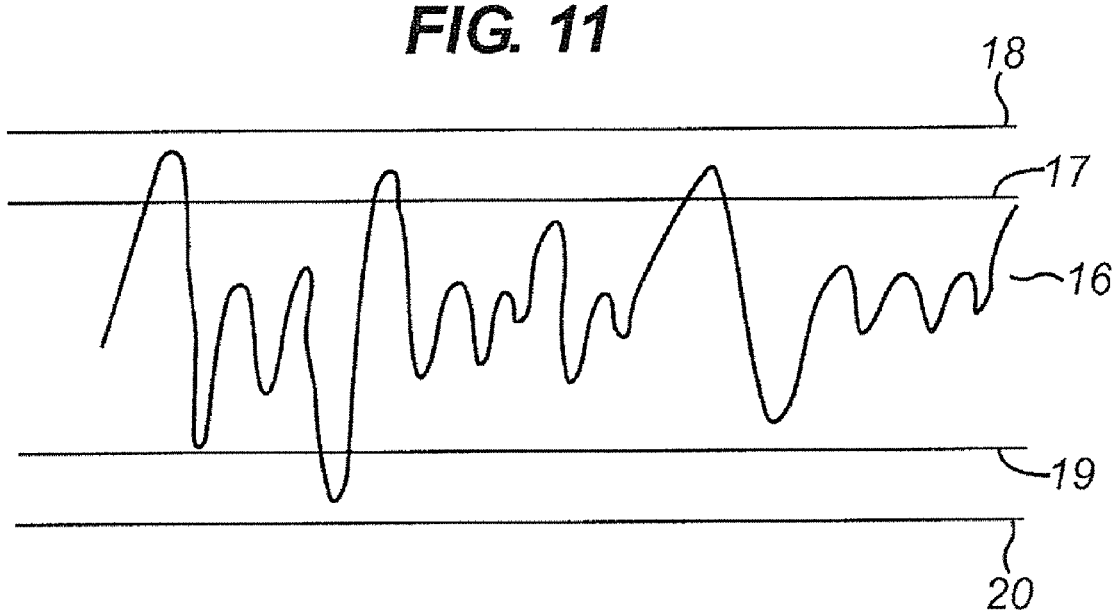
FIG. 11 shows an analog input signal compared against two upper and two lower thresholds.

One convenient way for the control unit to monitor the fluctuations of the analog input signal is for it to compare the signal with two upper and two lower thresholds. This is shown in FIG. 11. The analog input signal 16 is compared by the control unit with four thresholds: a first high threshold 17, a second high threshold 18, a first low threshold 19 and a second low threshold 20. The second high threshold is higher than the first high threshold, and the second low threshold is lower than the first low threshold, as shown in FIG. 11. In one embodiment, the voltage of each of the high thresholds is less than that of the upper limit of the modulator's input range and the voltage of each of the low thresholds is higher than that of the lower limit of the modulator's input range.

If the control unit detects that the analog input signal has exceeded either the second high threshold or the second low threshold, it may determine that the analog signal is in danger of being clipped. The control unit may then adjust the boundary values so that the gain and/or offset of the sigma-delta modulator is adjusted accordingly.

If the control unit detects that the analog input signal is not exceeding either the first high threshold or the first low threshold, it may determine that the analog signal should be amplified or that it should be positioned more centrally within the allowable input range. The control unit may then adjust the boundary values so that the gain and/or offset of the sigma-delta modulator is adjusted accordingly.

As before, one convenient way for the control unit to perform this comparison is for it to sample the analog input signal before it enters the sigma-delta modulator and to compare those samples with the voltage levels of the four thresholds. The control unit may be arranged such that a certain number of samples is required to be above or below the appropriate threshold before corrective action is taken. This number of samples may differ according to the severity of the consequences arising from lack of corrective action. For example, it could be that to avoid clipping only one sample exceeding the second higher or lower thresholds is required to trigger corrective action by the control unit while significantly more samples are required to fall within the first higher and lower thresholds before action to increase the sensitivity of the sigma-delta modulator is triggered.

The sigma-delta modulator has been described above with reference to some specific applications. This is for the purposes of example only and it should be understood that the sigma-delta modulator described herein can be incorporated into any application requiring an ADC. Such applications include, for example, digital media players, which are capable of detecting digital data.

The disclosure above can be applied to any kind of sigma-delta modulator, for example, analog, digital or switched capacitor. The description above has been limited to sigma-delta modulators having a loop filter that is an integrator, resulting in a low-pass sigma-delta modulator. However, in reality, the integrator could be replaced with any loop shaping element, thereby allowing for low-pass, band-pass or high-pass modulators, either analog or digital. Although the quantizer has been shown as a two-level type, it could have any number of levels. The method described herein is applicable to any order of modulator. It should be understood that the first-order sigma-delta modulator as described above is only an example, and that the disclosure may be used for other modulators.

Each individual feature described herein is hereby disclosed in isolation and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that various embodiments may consist of any such individual feature or combination of features. In view of the foregoing description it will be evident to a person skilled in the art that various modifications may be made to the disclosure above.

The invention claimed is:

1. A sigma-delta modulator, comprising:
   a summation unit configured to sum an analog input signal with an adjustment signal to form a summation output signal;
   an integrator configured to receive the summation output signal and form an integrator output signal dependent thereon;
   a quantizer configured to receive the integrator output signal and form a digital output signal dependent thereon; and
   a feedback loop configured to generate the adjustment signal by selecting between one of two boundary values for the adjustment signal in response to the digital output signal, wherein the feedback loop is further configured to compare the analog input signal to at least two threshold values and to adjust at least one of the two boundary values based, at least in part, on the comparison.

2. The sigma-delta modulator of claim 1, wherein the modulator is configured to iteratively generate the digital output signal and the adjustment signal, and wherein the feedback loop is further configured to select between one of the two boundary values at each iteration.

3. The sigma-delta modulator of claim 1, wherein the feedback loop is further configured to select between one of the two boundary values in dependence on the instantaneous value of the digital output signal.

4. The sigma-delta modulator of claim 3, wherein the quantizer is further configured to form the digital output signal by selecting between a first voltage level and a second voltage level, and wherein the feedback loop is further configured to select a first one of the boundary values in response to the digital output signal having the first voltage level and to select a second one of the boundary values in response to the digital output signal having the second voltage level.

5. The sigma-delta modulator of claim 4, wherein at least one of the first boundary value or the second boundary value is different from both the first voltage level and the second voltage level.

6. The sigma-delta modulator of claim 1, wherein the modulator is configured so that, if the first and second boundary values are held constant, then the digital output signal is representative of a level of the analog input signal in a range between the two boundary values.

7. The sigma-delta modulator of claim 1, wherein the feedback loop comprises a multiplexer configured to receive the digital output signal and to output one of the two boundary values in dependence on the digital output signal.

8. The sigma-delta modulator of claim 1, wherein the at least one of the two boundary values is adjusted in accordance with a dynamic range of the analog input signal.

9. The sigma-delta modulator of claim 1, wherein the feedback loop comprises a selection circuit, and wherein the selection circuit includes a control unit configured to generate first and second control signals in dependence on the analog input signal.

10. The sigma-delta modulator of claim 1, wherein the selection is performed in dependence on only the digital output signal.

11. The sigma-delta modulator of claim 9, wherein the selection circuit further comprises a first digital-to-analog converter and a second digital-to-analog converter, and wherein each of the first and second digital-to-analog converters is configured to receive a respective one of the first and second control signals and to output a respective boundary value in dependence on that control signal.

12. The sigma-delta modulator of claim 9, wherein the control unit is further configured to generate the first and second control signals to cause effective amplification of the analog input signal by the sigma-delta modulator.

13. The sigma-delta modulator of claim 9, wherein the control unit is further configured to generate the first and second control signals to cause effective offset of the analog input signal by the sigma-delta modulator.

14. The sigma-delta modulator of claim 9, wherein the control unit is further configured to generate the control signals by means of a predetermined algorithm.

15. The sigma-delta modulator of claim 14, wherein the control unit is further configured to select one of a plurality of predetermined algorithms to generate the control signals in dependence on the analog input signal.

16. The sigma-delta modulator of claim 9, wherein the sigma-delta modulator has a non-linear transfer function.

17. The sigma-delta modulator of claim 16, wherein the control unit is further configured to cause greater effective amplification of analog input signals varying within a relatively small voltage range than of analog input signals varying within a relatively large voltage range.

18. A digital media player comprising a sigma-delta modulator, the modulator including:
a summation unit configured to sum an analog input signal with an adjustment signal to form a summation output signal;
an integrator configured to receive the summation output signal and form an integrator output signal dependent thereon;
a quantizer configured to receive the integrator output signal and form a digital output signal dependent thereon; and
a feedback loop configured to generate the adjustment signal and comprising a selection circuit configured to form the adjustment signal by selecting between one of two boundary values for the adjustment signal in response to the digital output signal, wherein the feedback loop is further configured to compare the analog input signal to at least two threshold values and to adjust at least one of the two boundary values based, at least in part, on the comparison.

19. The digital media player of claim 18, wherein each of the two boundary values corresponds to a respective voltage level, and wherein the digital media player further comprises a control unit configured to generate first and second control signals to set the respective voltage levels.

20. The digital media player of claim 19, wherein the digital media player is configured to play optical discs, and wherein the control unit is further configured to receive a signal from a detection device that is representative of a reflectivity of an optical disc and to generate the first and second control signals in dependence on that signal.

21. A method, comprising:
summing an analog input signal with an adjustment signal to form a summation output signal;
receiving the summation output signal at an integrator configured to form an integrator output signal dependent thereon;
receiving the integrator output signal at a quantizer configured to form a digital output signal dependent thereon;
comparing the analog input signal to at least two threshold values;
adjusting at least one of two boundary values based, at least in part, on the comparison; and
generating the adjustment signal by selecting between one of the two boundary values for the adjustment signal in response, at least in part, to the digital output signal.

22. A sigma-delta modulator, comprising:
a summation unit configured to sum an analog input signal with an adjustment signal to form a summation output signal;
an integrator configured to receive the summation output signal and form an integrator output signal dependent thereon;
a quantizer configured to receive the integrator output signal and form a digital output signal dependent thereon; and
a feedback loop configured to generate the adjustment signal in response to the digital output signal so that, in response to a transition between two output values in the digital output signal, the adjustment signal is formed to have a coincident transition between two boundary values, wherein the feedback loop is further configured to compare the analog input signal to at least two threshold values and to adjust at least one of the two boundary values based, at least in part, on the comparison.

23. The sigma-delta modulator of claim 22, wherein the feedback loop is further configured to form the adjustment signal so that at least one of the two boundary values is different from both of the two output values.

24. The sigma-delta modulator of claim 22, wherein the two output values and the two boundary values each comprise a relatively high value and a relatively low value, and wherein the feedback loop is further configured to, in response to a transition in one direction between the relatively high output value and the relatively low output value, form the adjustment signal to have a transition in the same direction between the relatively high boundary value and the relatively low boundary value.

25. A digital media player comprising a sigma-delta modulator, the modulator including:
a summation unit configured to sum an analog input signal with an adjustment signal to form a summation output signal;
an integrator configured to receive the summation output signal and form an integrator output signal dependent thereon;
a quantizer configured to receive the integrator output signal and form a digital output signal dependent thereon; and
a feedback loop configured to generate the adjustment signal in response to the digital output signal so that, in response to a transition between two output values in the digital output signal, the adjustment signal is formed to have a coincident transition between two boundary values, wherein at least one of the two boundary values is adjusted based, at least in part, on a comparison of the analog input signal to at least two threshold values.

26. A method, comprising:
converting an analog input signal into a digital output signal using a sigma-delta modulator, wherein the sigma-delta modulator has an input range, and wherein the sigma-delta modulator has a feedback signal having a first boundary value and a second boundary value;
comparing the analog input signal to at least two threshold values; and
adjusting the input range of the sigma-delta modulator by adapting at least one of the first boundary value or the second boundary value based, at least in part, on the comparison.

27. The method of claim 26, further comprising:
monitoring a dynamic range of the analog input signal; and
adjusting the input range of the sigma-delta modulator in accordance with the dynamic range of the analog input signal.

28. The method of claim 27, wherein said monitoring a dynamic range comprises sampling the analog input signal and comparing an amplitude of the sampled analog input signal with both a first threshold value equal to the first boundary value and a second threshold value equal to the second boundary value.

29. The method of claim 26, wherein said adjusting the input range comprises:
determining that the dynamic range of the analog input signal exceeds the input range of the sigma-delta modulator; and
increasing the input range of the sigma-delta modulator by adjusting at least one of the first boundary value or the second boundary value.

30. The method of claim 29, wherein said increasing the input range decreases an implied gain of the sigma-delta modulator.

31. The method of claim 29, wherein said determining comprises:
   comparing the analog signal to a first threshold and a second threshold, wherein the first threshold is greater than the second threshold; and
   determining that the analog signal extends above the first threshold and below the second threshold.

32. The method of claim 26, wherein said adjusting the input range comprises:
   determining that the dynamic range of the analog input signal is smaller than the input range of the sigma-delta modulator; and
   decreasing the input range of the sigma-delta modulator by adjusting at least one of the first boundary value or the second boundary value.

33. The method of claim 32, wherein said decreasing the input range increases an implied gain of the sigma-delta modulator.

34. The method of claim 32, wherein said determining comprises:
   comparing the analog signal to a first threshold and a second threshold, wherein the first threshold is greater than the second threshold; and
   determining that the analog signal does not extend above the first threshold or below the second threshold.

35. The method of claim 28, further comprising adjusting an implied offset of the sigma-delta modulator by adjusting both the first boundary value and the second boundary value.

36. The method of claim 26, wherein said adapting at least one of the first boundary value or the second boundary value comprises selecting each of the first boundary value and the second boundary value from a set of predetermined boundary values stored in a control unit.

37. The method of claim 26, wherein said adapting at least one of the first boundary value or the second boundary value comprises:
   generating the first boundary value using a first digital-to-analog converter (DAC) and the second boundary value using a second DAC;
   adjusting at least one of the first boundary value or the second boundary value by controlling the first DAC or the second DAC respectively using a control unit; and
   selecting one of the first boundary value or the second boundary value for the feedback signal using a multiplexer controlled by the digital output signal.

38. The method of claim 26, wherein said adjusting the input range comprises:
   determining that the dynamic range of the analog input signal is not equal to the input range of the sigma-delta modulator; and
   offsetting the input range of the sigma-delta modulator by adjusting at least one of the first boundary value or the second boundary value.

39. The method of claim 38, wherein said offsetting the input range changes an implied offset of the sigma-delta modulator.

40. The method of claim 38, wherein said determining comprises:
   comparing the analog signal to a first threshold and a second threshold, wherein the first threshold is greater than the second threshold; and
   determining that the analog signal extends either above the first threshold or below the second threshold without also extending respectively either below the second threshold or above the first threshold.

* * * * *